(12) United States Patent
Okada et al.

(10) Patent No.: US 7,759,779 B2
(45) Date of Patent: Jul. 20, 2010

(54) SEMICONDUCTOR DEVICE AND METHOD OF MANUFACTURING THE SAME

(75) Inventors: Kazuo Okada, Gunma (JP); Hiroyuki Shinogi, Gunma (JP); Yoshinori Seki, Gunma (JP); Hiroshi Yamada, Kanagawa (JP)

(73) Assignees: Sanyo Semiconductor Co., Ltd., Gunma (JP); Sanyo Electric Co., Ltd., Osaka (JP)

( * ) Notice: Subject to any disclaimer, the term of this patent is extended or adjusted under 35 U.S.C. 154(b) by 5 days.

(21) Appl. No.: 12/104,516

(22) Filed: Apr. 17, 2008

(65) Prior Publication Data

US 2008/0265441 A1 Oct. 30, 2008

(30) Foreign Application Priority Data

Apr. 25, 2007 (JP) .............................. 2007-115911

(51) Int. Cl.
*H01L 23/02* (2006.01)
(52) U.S. Cl. ........................................ 257/678; 438/114
(58) Field of Classification Search ...................... None
See application file for complete search history.

(56) References Cited

U.S. PATENT DOCUMENTS

| 2003/0230805 | A1* | 12/2003 | Noma et al. | ................. 257/737 |
| 2004/0137701 | A1* | 7/2004 | Takao | .......................... 438/461 |
| 2004/0235270 | A1* | 11/2004 | Noma et al. | ................. 438/460 |
| 2004/0262732 | A1* | 12/2004 | Noma et al. | ................. 257/685 |
| 2005/0048740 | A1* | 3/2005 | Noma et al. | ................. 438/460 |
| 2005/0208735 | A1* | 9/2005 | Noma et al. | ................. 438/460 |
| 2006/0033198 | A1* | 2/2006 | Noma et al. | ................. 257/698 |
| 2006/0270093 | A1* | 11/2006 | Noma et al. | ................... 438/64 |
| 2007/0026639 | A1* | 2/2007 | Noma et al. | ................. 438/459 |

FOREIGN PATENT DOCUMENTS

JP 2005-072554 3/2005

* cited by examiner

*Primary Examiner*—Ha Tran T Nguyen
*Assistant Examiner*—Shantanu C Pathak
(74) *Attorney, Agent, or Firm*—Morrison & Foerster LLP

(57) ABSTRACT

The invention enhances moisture resistance between a supporting body and an adhesive layer to enhance the reliability of a semiconductor device. A semiconductor device of the invention has a first insulation film formed on a semiconductor element, a first wiring formed on the first insulation film, a supporting body formed on the semiconductor element with an adhesive layer being interposed therebetween, a third insulation film covering the back surface of the semiconductor element onto the side surface thereof and the side surface of the adhesive layer, a second wiring connected to the first wiring and extending onto the back surface of the semiconductor element with the third insulation film being interposed therebetween, and a protection film formed on the second wiring.

5 Claims, 8 Drawing Sheets

SEMICONDUCTOR DEVICE AND METHOD OF MANUFACTURING THE SAME

CROSS-REFERENCE OF THE INVENTION

This application claims priority from Japanese Patent Application No. 2007-115911, the content of which is incorporated herein by reference in its entirety.

BACKGROUND OF THE INVENTION

1. Field of the Invention

The invention relates to a semiconductor device and a method of manufacturing the same, particularly, a package having about the same outside dimensions as those of a semiconductor element packaged in it and a method of manufacturing the same.

2. Description of the Related Art

A CSP (chip size package) has received attention in recent years as a packaging technology. The CSP is a small package having about the same outside dimensions as those of a semiconductor element packaged in it. A BGA type semiconductor device has been known as a type of the CSP. In the BGA type semiconductor device, a plurality of ball-shaped conductive terminals made of metal such as solder is arrayed in a grid pattern on one surface of a package and is electrically connected to a semiconductor element formed on the other surface of the package.

When the BGA type semiconductor device is mounted on electronic equipment, the semiconductor element is electrically connected to an external circuit on a printed board by bonding the conductive terminals to wiring patterns on the printed board.

Such a BGA type semiconductor device has advantages in providing a large number of conductive terminals and in reducing a size over an SOP (small outline package), a QFP (quad flat Package) or the like, which have lead pins protruding from their sides. This BGA type semiconductor device is used as, for example, an image sensor chip of a digital camera mounted on a cellular phone.

FIGS. 13 to 15 show a method of manufacturing a conventional semiconductor device. As shown in FIG. 13, a semiconductor substrate is provided in which first wirings 53 are formed on semiconductor elements 51 with an insulation film 52 being interposed therebetween and a glass substrate 54 is attached to the substrate with an adhesive layer 55 so as to cover the first wirings 53. Second wirings 57 are further formed being connected to the first wirings 53 and extending onto the back surfaces of the semiconductor elements 51 with an insulation film 56 being interposed therebetween. Then, a process of forming slit groove G in the semiconductor substrate with a dicing blade is performed prior to separation of the semiconductor substrate into each of the individual semiconductor elements 51 along the border S (a dicing line).

Then, a protection film 58 made of a solder resist film is formed on the back surface of the semiconductor substrate including the slit groove G as shown in FIG. 14, and then conductive terminals 59 are formed through a predetermined process as shown in FIG. 15. Finally, the glass substrate 54 is separated along the border (called a dicing line or a scribe line) S, thereby completing semiconductor devices.

The relevant technique is described in Japanese Patent Application Publication No. 2005-72554.

As shown in FIG. 15, the conventional semiconductor device has low moisture resistance at a contact portion A of the protection film 58 made of hygroscopic resin and the adhesive layer 55, and it is likely that moisture or the like infiltrates between the adhesive layer and the glass substrate or the like to separate the glass substrate 54 or the like from the semiconductor element 51. Furthermore, the surface where the slit groove G is mechanically formed with the dicing blade is uneven, thereby causing reduction in adhesion of the glass substrate 54 and the protection film 58.

SUMMARY OF THE INVENTION

The invention provides a semiconductor device including: a first wiring formed on a semiconductor element; a supporting body attached to the semiconductor element with an adhesive layer being interposed therebetween; an insulation film covering a back surface of the semiconductor element onto a side surface thereof and a side surface of the adhesive layer; a second wiring connected to the first wiring and extending onto the back surface of the semiconductor element with the insulation film being interposed therebetween; and a protection film formed on the semiconductor element including the second wiring.

The invention further provides a method of manufacturing a semiconductor device, including: providing a semiconductor substrate formed with a first wiring on its front surface; attaching a supporting body to the semiconductor substrate with an adhesive layer being interposed therebetween; etching a back surface of the semiconductor substrate along a border of a plurality of semiconductor elements; forming an insulation film covering a back surface of the semiconductor element onto a side surface thereof and a side surface of the adhesive layer; forming a second wiring connected to the first wiring and extending onto the back surface of the semiconductor element with the insulation film being interposed therebetween; forming a protection film on the semiconductor element including the second wiring; and performing dicing along the border of the plurality of semiconductor elements.

DETAILED DESCRIPTION OF THE INVENTION

Hereafter, a semiconductor device of a first embodiment of the invention and a method of manufacturing the same will be described referring to FIGS. 1 to 11.

Figure 1:
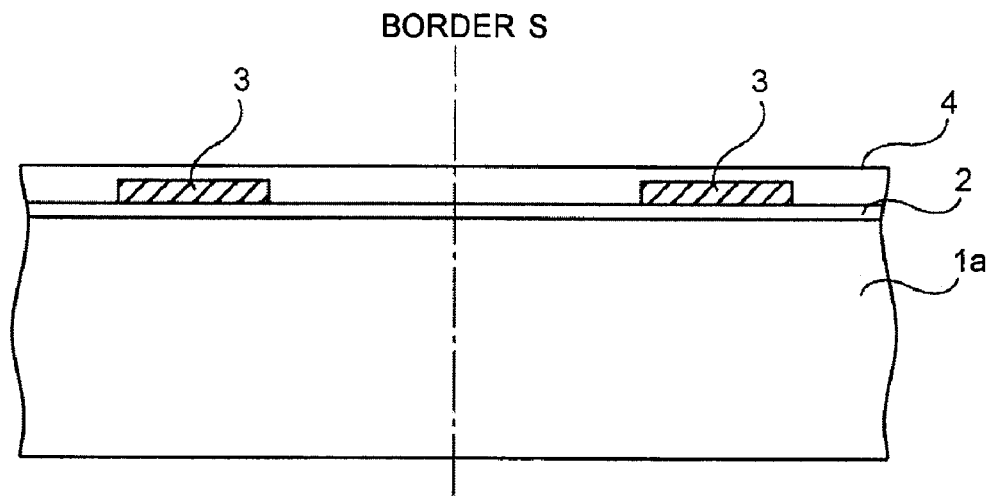
FIGS. 1 to 11 are cross-sectional views showing a method of manufacturing a semiconductor device of a first embodiment of the invention.

First, a semiconductor substrate (a semiconductor wafer) 1a is provided as shown in FIG. 1. The semiconductor substrate 1a is formed with, for example, a CCD or CMOS image sensor, an illuminance sensor, a color sensor, a photodiode, a light receiving element for CD, DVD or Blu-ray Disc, a semiconductor memory, or the like. Such a substrate with device elements is called a semiconductor element. A plurality of first wirings 3 is formed on the front surface of the substrate with a first insulation film 2 being interposed therebetween.

The first wirings 3 are formed near a border S (called a dicing line or a scribe line) for separating the semiconductor elements in a dicing process performed afterward (i.e. near the ends of the semiconductor elements), having a given space therebetween to form a pair. The first wirings 3 are not necessarily formed as a pair, and may be disposed near the border S at a given interval therebetween.

The first wirings 3 are external connection pads extending near the border S separating a plurality of semiconductor devices and electrically connected to internal elements forming the semiconductor devices, respectively.

A second insulation film 4 is formed as a passivation film on the semiconductor substrate 1a including the first wirings 3.

Figure 2:
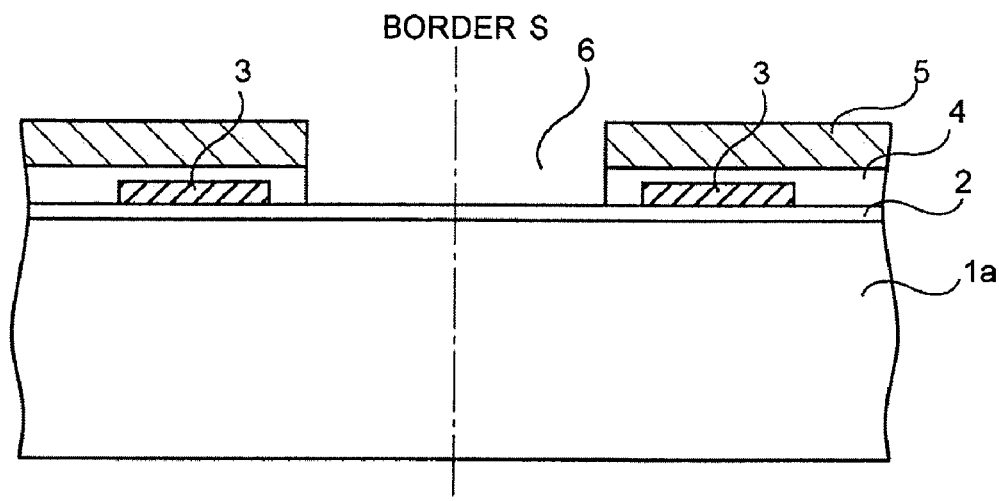

Then, as shown in FIG. 2, using a resist film 5 with an opening formed on the second insulation film 4 as a mask, the second insulation film 4 and the first insulation film 2 are etched and removed by a predetermined etching process to form an opening 6 exposing a portion of the semiconductor substrate 1a.

Figure 3:
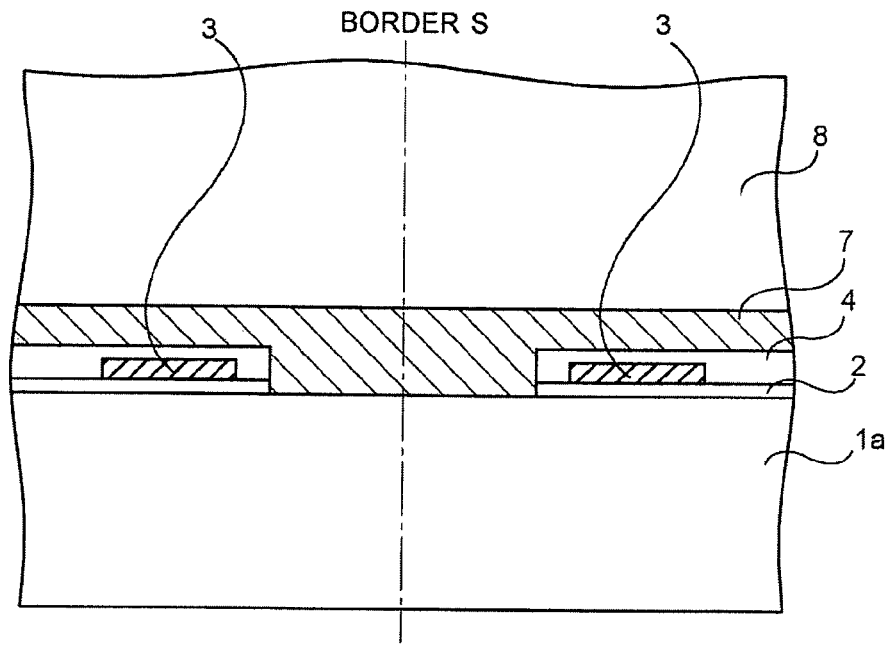

Then, as shown in FIG. 3, a supporting body 8 (e.g. a glass substrate) is attached to the semiconductor substrate 1a with an adhesive layer 7 (e.g. an epoxy resin, an acrylic resin or the like).

Although the glass substrate is used as the supporting body and the epoxy resin, acrylic resin or the like is used as the adhesive layer in this embodiment, a silicon substrate, a plastic board or the like may be used as the supporting body and a suitable adhesive layer may be selected for this supporting body.

While it is necessary to use a transparent supporting body and a transparent adhesive layer for a semiconductor element of an optical system, a transparent material is not necessarily selected for other semiconductor elements. Furthermore, a tape or sheet form supporting body may be attached with the adhesive layer, or the adhesive layer is not necessary when a tape or sheet form adhesive supporting body is used.

Figure 4:
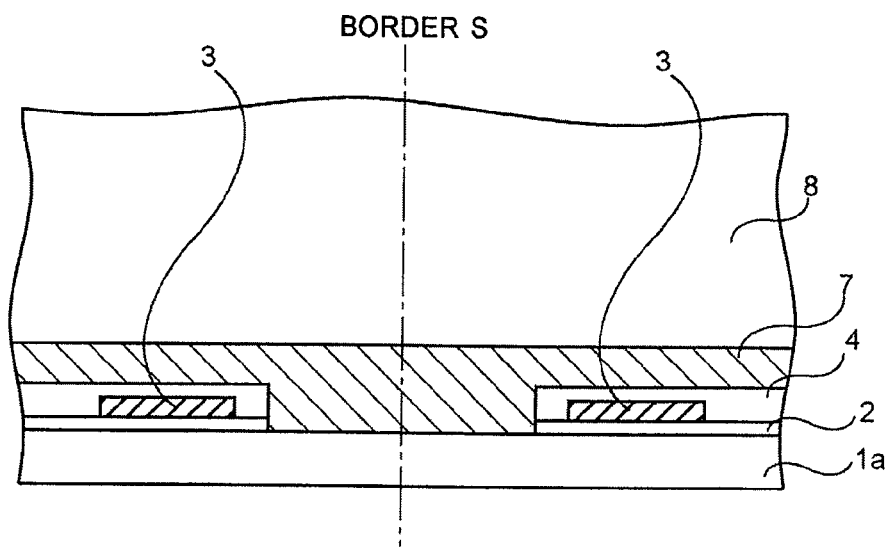

Then, as shown in FIG. 4, the semiconductor substrate 1a is ground on the side opposite to the surface where the supporting body 8 is attached (the back surface of the semiconductor substrate) to thin the substrate into about 100 µm.

In this process, even when the semiconductor substrate 1a is thinned, the semiconductor substrate 1a is supported by the supporting body 8 and thus warping or the like does not occur, thereby facilitating handling the substrate. When the semiconductor substrate 1a need not be thinned, this process is omitted.

Scratches are formed on the ground surface of the semiconductor substrate 1a to form concaves and convexes with several micrometers of widths and depths, leaving grinding unevenness. For removing this, the ground surface of the semiconductor substrate 1a is lightly etched with chemicals or the like. When the semiconductor substrate 1a is made of silicon, hydrofluoric acid and nitric acid type chemicals or the like is used for the light etching. This light etching may be performed by dry-etching.

Figure 5:
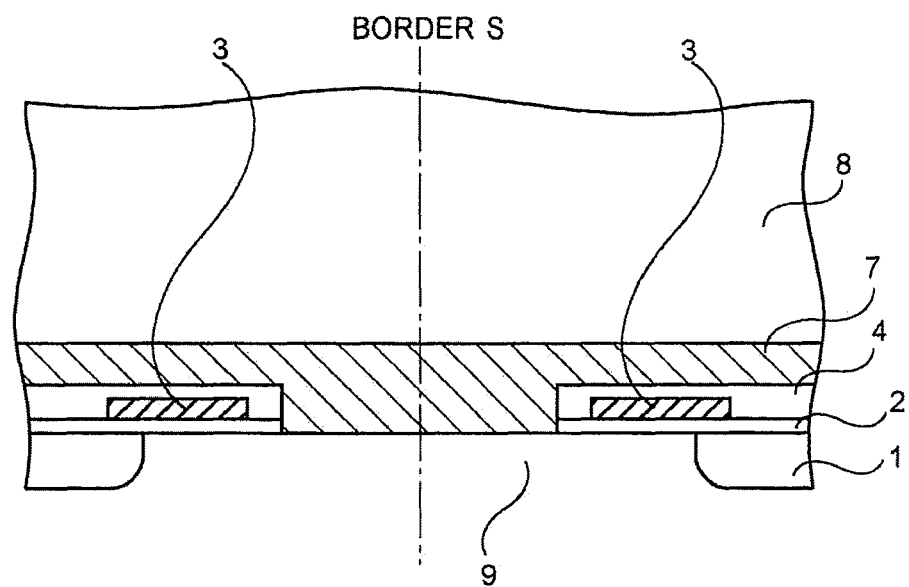

Then, as shown in FIG. 5, using a resist film with an opening (not shown) formed on the back surface of the semiconductor substrate 1a as a mask, an opening 9 is formed in the semiconductor substrate 1a by predetermined etching so as to partially expose the first insulation film 2 under the first wiring 3 and the adhesive layer 7. In this process, the opening is provided along the border S of the semiconductor elements by predetermined isotropic etching or anisotropic etching with chemicals or etching gas which provide the high selectivity of the semiconductor substrate 1a to the first insulation film 2.

Figure 6:
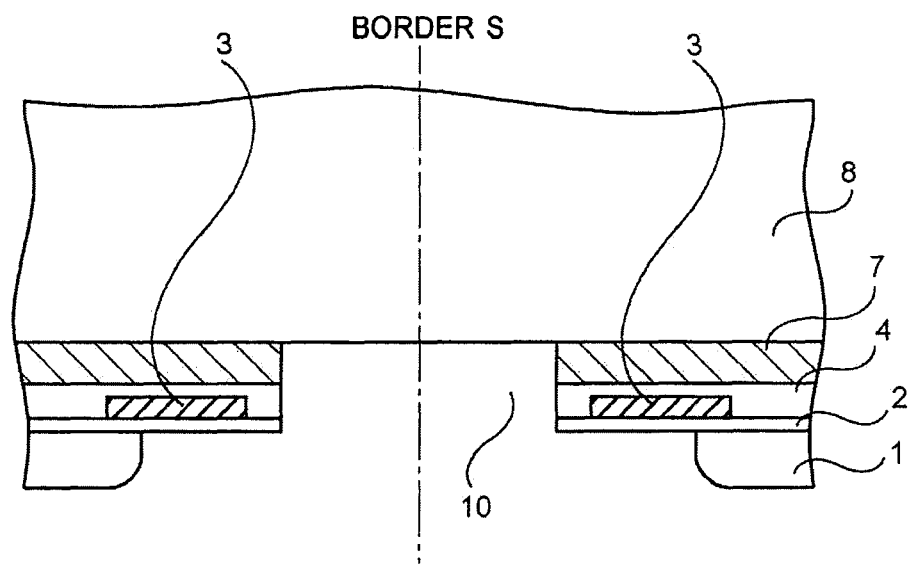

Then, as shown in FIG. 6, an ashing process is performed to the resist film to remove the resist film and a portion of the adhesive layer 7, thereby forming an opening 10.

Figure 7:
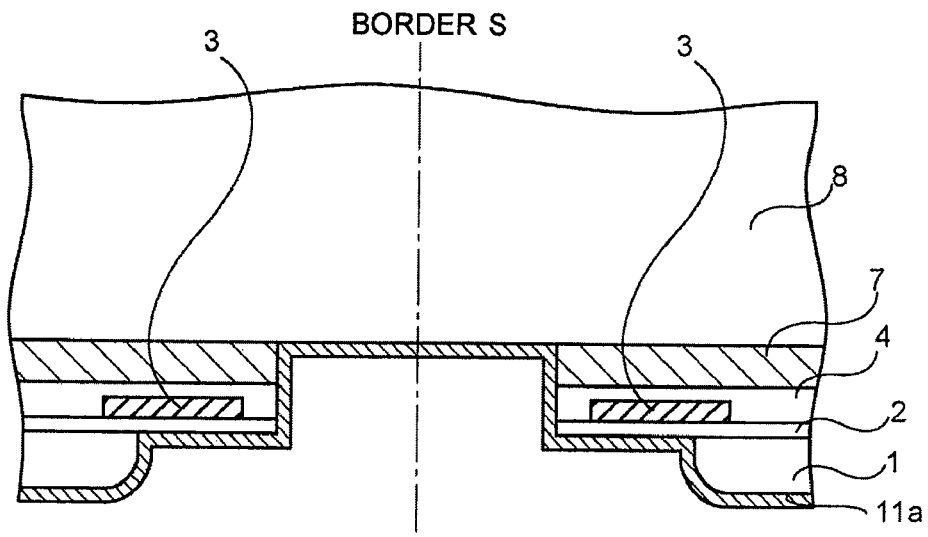

Then, as shown in FIG. 7, a third insulation film 11a with about 3 µm thickness is formed on the back surface of the semiconductor element 1. At this time, as the third insulation film 11a, a silicon oxide film, a silicon nitride film, or the like is formed by a CVD method.

Figure 8:
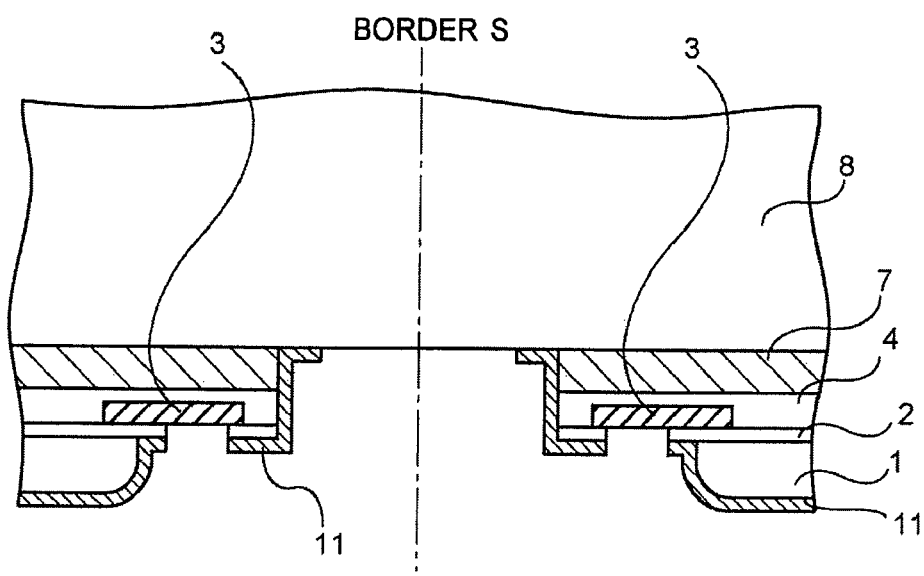

Then, as shown in FIG. 8, using a resist film with an opening (not shown) formed on the back surface of the semiconductor element 1 as a mask, the third insulation film 11a and the first insulation film 2 are etched to expose the first wirings 3 partially. At this time, the third insulation film 11a is patterned into a third insulation film 11 covering the side end portions of the semiconductor elements 1 and the adhesive layer 7.

Figure 9:
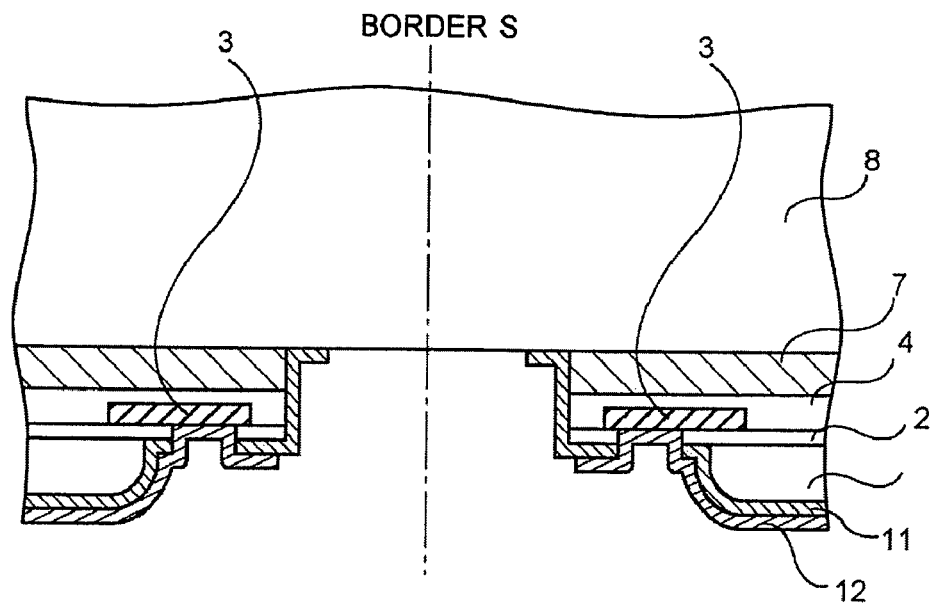

Then, second wirings 12 are formed being connected to the back surfaces of the first wiring 3 and extending onto the back surfaces of the semiconductor elements 1 with the third insulation film 11 being interposed therebetween. Thus, the first wirings 3 and the second wirings 12 are electrically connected as shown in FIG. 9.

Figure 10:
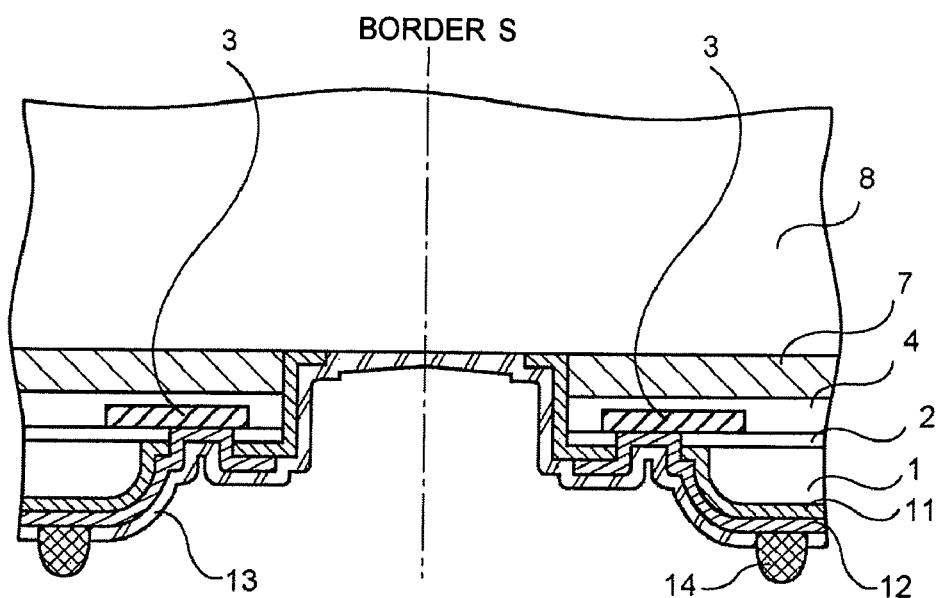

Then, an Ni—Au plating film (not shown) is formed on the second wirings 12, and then a protection film 13 made of, for example, a solder resist film is formed so as to cover the back surfaces of the semiconductor elements 1 as shown in FIG. 10. Alternatively, instead of forming the Ni—Au plating film on the whole surfaces of the second wirings 12, the Ni—Au plating film may be formed on the second wirings 12 exposed in openings of the protection film 13 after the openings are formed in the protection film 13.

For forming the protection film 13, a spin coating process may be used in which thermosetting organic resin is dropped from above the semiconductor elements 1 with those back surfaces being oriented upward, the semiconductor elements 1 (the supporting body 8) are rotated, and the organic resin is spread on the substrate surface by the centrifugal force generated by this rotation, or a spray coating process may be used.

Then, openings are formed in the protection film 13 in the positions where ball-shaped conductive terminals 14 are to be formed, and the conductive terminals 14 are formed on the Ni—Au plating film. The ball-shaped conductive terminals 14 are solder bumps or gold bumps.

Figure 11:
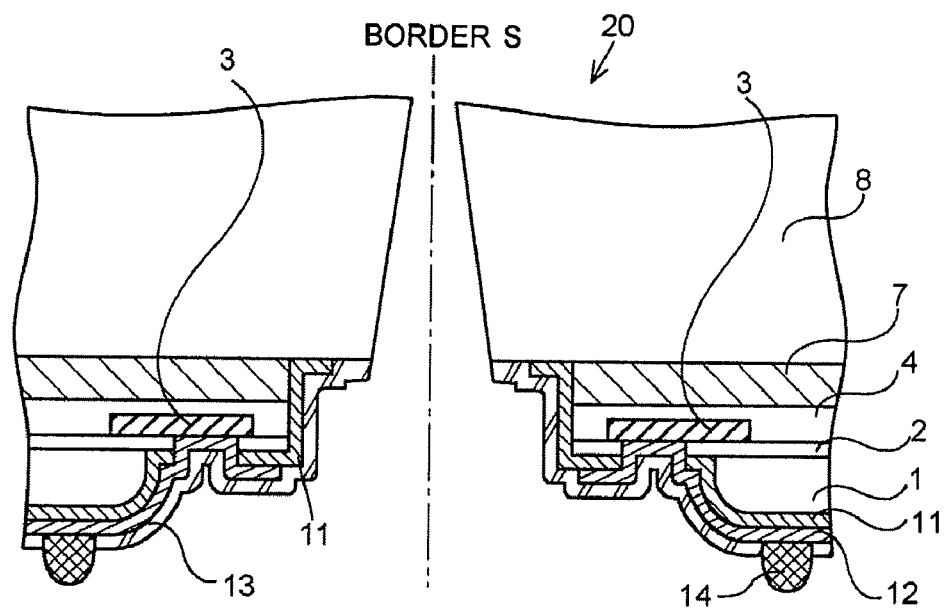

Then, as shown in FIG. 11, dicing is performed along the border S to separate each of the semiconductor elements 1, thereby forming CSP type semiconductor devices 20.

In the semiconductor device of the invention having the structure as described above, the third insulation film 11 made of an inorganic film is formed so as to cover the back surfaces of the semiconductor elements onto the side surfaces thereof and the side surfaces of the adhesive layer 7, so that the adhesive layer 7 is protected from the protection film 13 having the low moisture resistance and the moisture resistance of the semiconductor device 20 is enhanced.

Furthermore, as shown in FIG. 6, since the adhesive layer 7 is separated chemically by etching in this embodiment, it is not necessary to perform a process of forming a slit groove G such as in the conventional method, thereby enhancing the workability.

Furthermore, in this embodiment, it is not necessary to secure the dicing width for forming the slit groove G, and the yield is enhanced by that amount.

Furthermore, although in the conventional device a protection film 58 is attached to the surface (uneven surface) of an adhesive layer 55 mechanically separated with a dicing blade and thus the adhesion is degraded, in the embodiment the protection film 13 is attached to the side surface of the semiconductor element, which is chemically treated by etching, with the insulation film 11 being interposed therebetween and thus the adhesion is enhanced.

Figure 12:
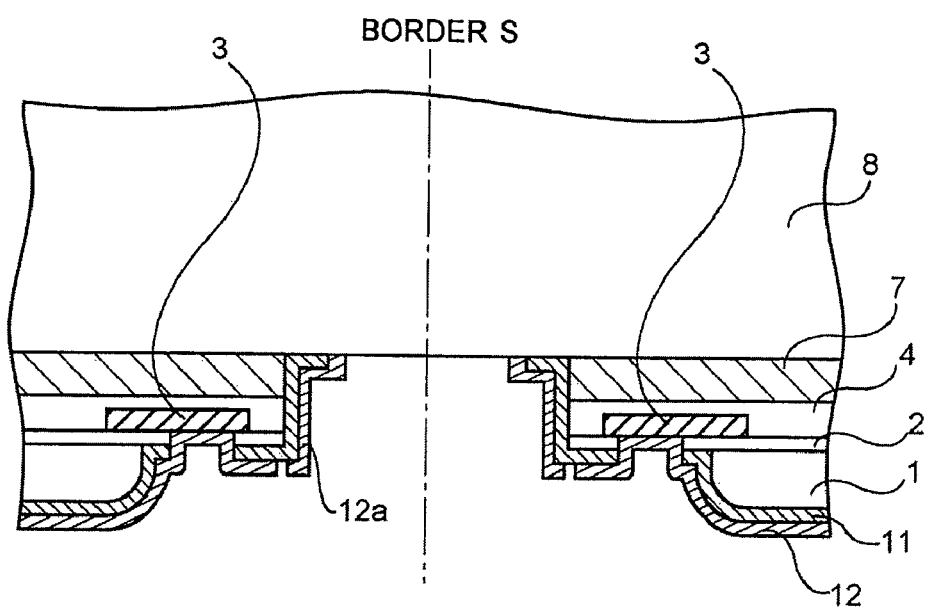
FIG. 12 is a cross-sectional view showing a method of manufacturing a semiconductor device of a second embodiment of the invention.
Figure 13:
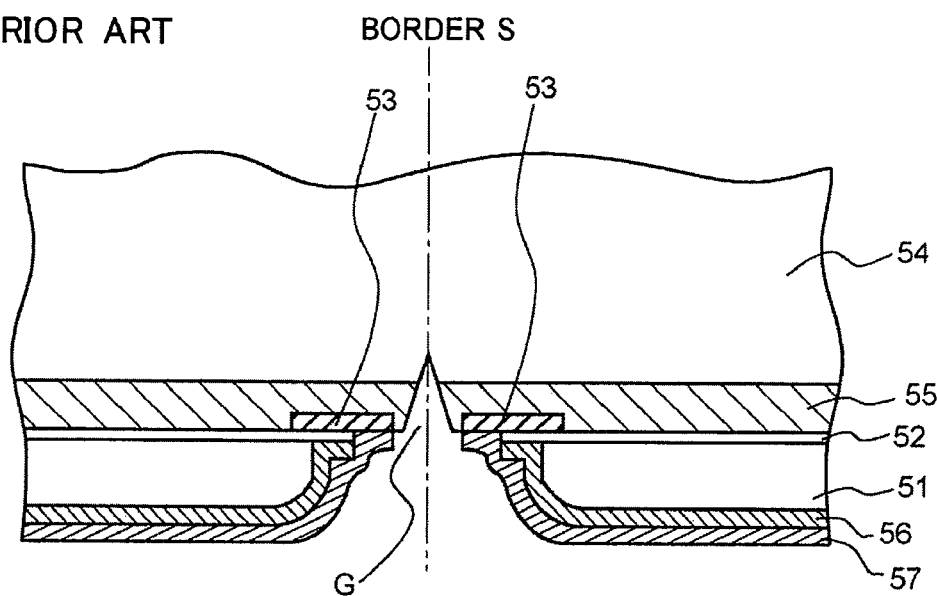
FIGS. 13 to 15 are cross-sectional views showing a method of manufacturing a conventional semiconductor device.
Figure 14:
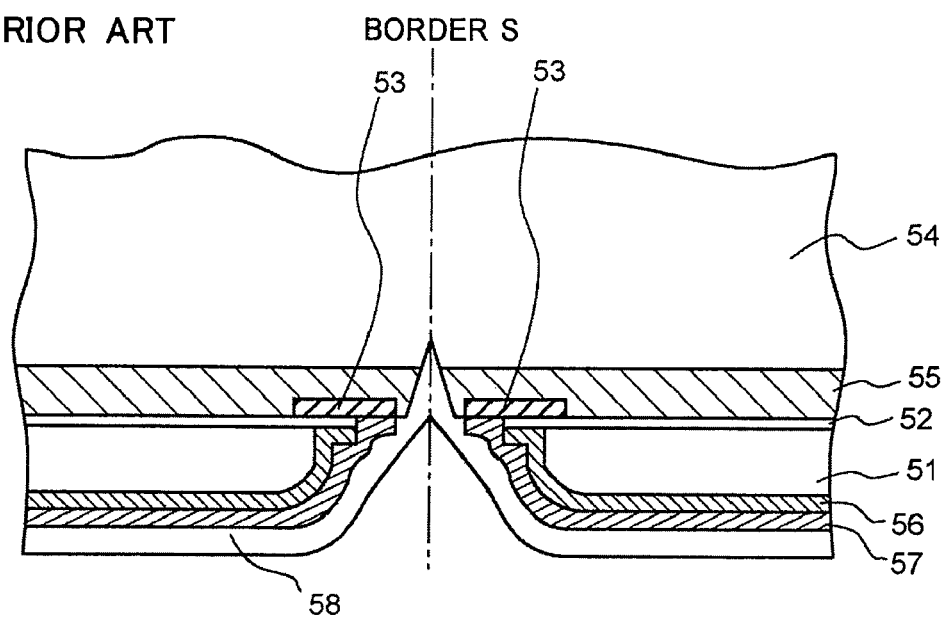
Figure 15:
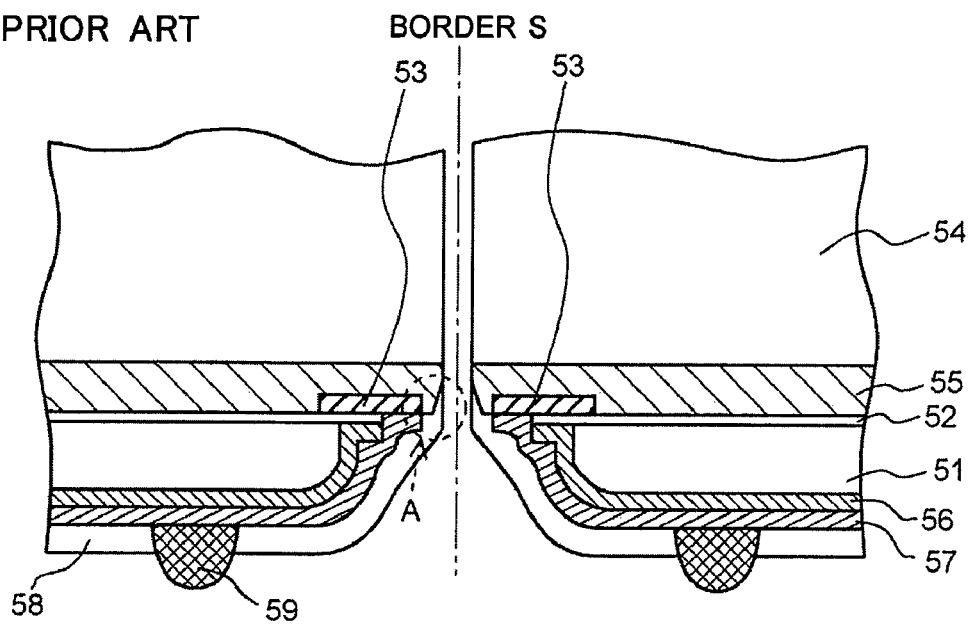

As a second embodiment of the invention, as shown in FIG. 12, when the second wirings 12 are patterned in the state where the third insulation films 11 are already formed, the side surfaces of the adhesive layer 7 may be covered by the third insulation films 11 and metal layers 12a by patterning the second wirings 12 so as to leave the metal layers 12a made of the same layer as the second wirings 12 over the side surfaces of the adhesive layer 7. This further enhances the moisture resistance of the semiconductor device.

Furthermore, although the invention is applied to the semiconductor device 20 in which the second wiring 12 is connected to the first wiring 3 extending near the border S in the first and second embodiments of the invention, the invention may be applied to a semiconductor device 30 in which a second wiring 12b is connected to a first wiring 3a of a general pad electrode not extending near the border S (formed inside the semiconductor device).

Figure 16:
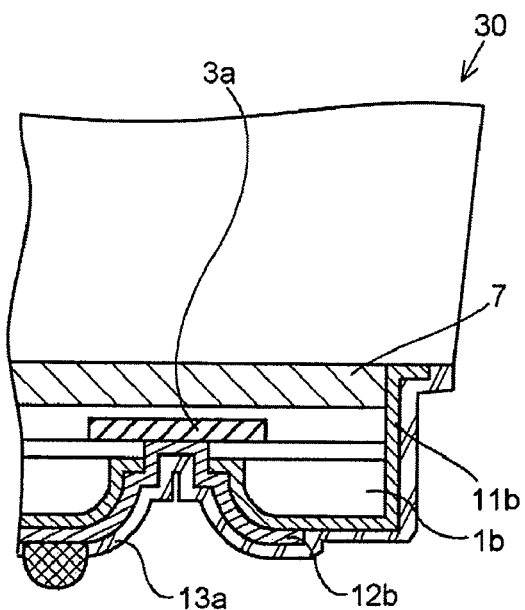
FIG. 16 is a cross-sectional view showing a method of manufacturing a semiconductor device of a third embodiment of the invention.

In detail, as a third embodiment, as shown in FIG. 16, with a third insulation film 11b being formed covering the back surface of a semiconductor element 1b onto the side surface thereof and the side surface of the adhesive layer 7, the second wiring 12b is patterned. Then, a protection layer 13a is formed on the whole surface and the conductive terminal is formed therein.

In the above described third embodiment, in the similar manner to the second embodiment, the side surface of the adhesive layer 7 may be covered by the third insulation film 11b and a metal layer made of the same layer as the second wiring 12b by patterning the second wiring 12b so as to leave the metal layer over the side surface of the adhesive layer 7.

Furthermore, the invention may be applied to a semiconductor device having a structure in which the conductive terminals 14 are directly connected to the first wirings 3, 3a without through the second wirings 12, 12b.

Although the ball-shaped conductive terminals 14 electrically connected to the second wirings 12, 12b are formed in the above described embodiments, the invention is not limited to this. It means that the invention may be applied to a semiconductor device in which a ball-shaped conductive terminal is not formed (e.g. LGA: Land Grid Array type package).

The devices in the above embodiments have an improved moisture resistance between the supporting body and the adhesive layer by forming the insulation film covering the back surface of the semiconductor element and the side surface thereof and the side surface of the adhesive layer, thereby enhancing the reliability of the semiconductor device.

What is claimed is:

1. A semiconductor device comprising:
    a semiconductor element having a front surface, a back surface opposite from the front surface of the semiconductor element and a side surface connecting the front and back surfaces of the semiconductor element;
    a first wiring formed on the front surface of the semiconductor element;
    a supporting body disposed on the front surface of the semiconductor element;
    an adhesive layer attaching the supporting body to the front surface of the semiconductor element, the adhesive layer having a front surface, a back surface opposite from the front surface of the adhesive layer and a side surface connecting the front and back surfaces of the adhesive layer, the back surface of the adhesive layer facing the front surface of the semiconductor element;
    an insulation film covering the back surface of the semiconductor element, the side surface of the semiconductor element and the side surface of the adhesive layer;
    a second wiring disposed on the insulation film so as to be connected to the first wiring; and
    a protection film covering the second wiring.

2. The semiconductor device of claim 1, further comprising a conductive terminal disposed on the second wiring.

3. The semiconductor device of claim 1, wherein the second wiring is connected to a surface of the first wiring that faces the front surface of the semiconductor element.

4. The semiconductor device of claim 1, further comprising a metal film disposed on a portion of the insulation film covering the side surface of the adhesive layer.

5. The semiconductor device of claim 1, wherein the insulation film comprises an inorganic film.

* * * * *